April 28, 1970 J. P. GLEASON 3,509,461

SIGNAL TRANSLATING SYSTEM HAVING A VOLTAGE CONTROLLED OSCILLATOR

Filed Aug. 21, 1967

INVENTOR:
Joseph P. Gleason
By William W. Randle
AGENT

United States Patent Office 3,509,461
Patented Apr. 28, 1970

3,509,461

SIGNAL TRANSLATING SYSTEM HAVING A VOLTAGE CONTROLLED OSCILLATOR

Joseph P. Gleason, Woodland Hills, Calif., assignor to Northrop Corporation, Beverly Hills, Calif., a corporation of California Filed Aug. 21, 1967, Ser. No. 661,892
Int. Cl. G01r *19/26, 17/06*
U.S. Cl. 324—120 2 Claims

ABSTRACT OF THE DISCLOSURE

This patent application discloses an input transducer circuit in the form of a bridge, feeding a D.C. amplifier which controls the output frequency of a multivibrator. From the output circuit of the multivibrator, a fast-acting negative fedback is connected to the input bridge. Around the D.C. amplifier, a slow-acting anti-drift circuit is provided which tends to keep the multivibrator input at a selected level regardless of long-term drift tendencies, while not interfering with system operating in response to normal signal changes. The anti-drift circuit comprises a servo having a heating member to which an amplifier error current is fed, to change the temperature and hence resistance of a cathode resistor in the input tube of the D.C. amplifier, thus changing the balance of the input stage of the D.C. amplifier in the direction to tend to maintain the multivibrator input voltage at the selected level.

Figures 1, 2:
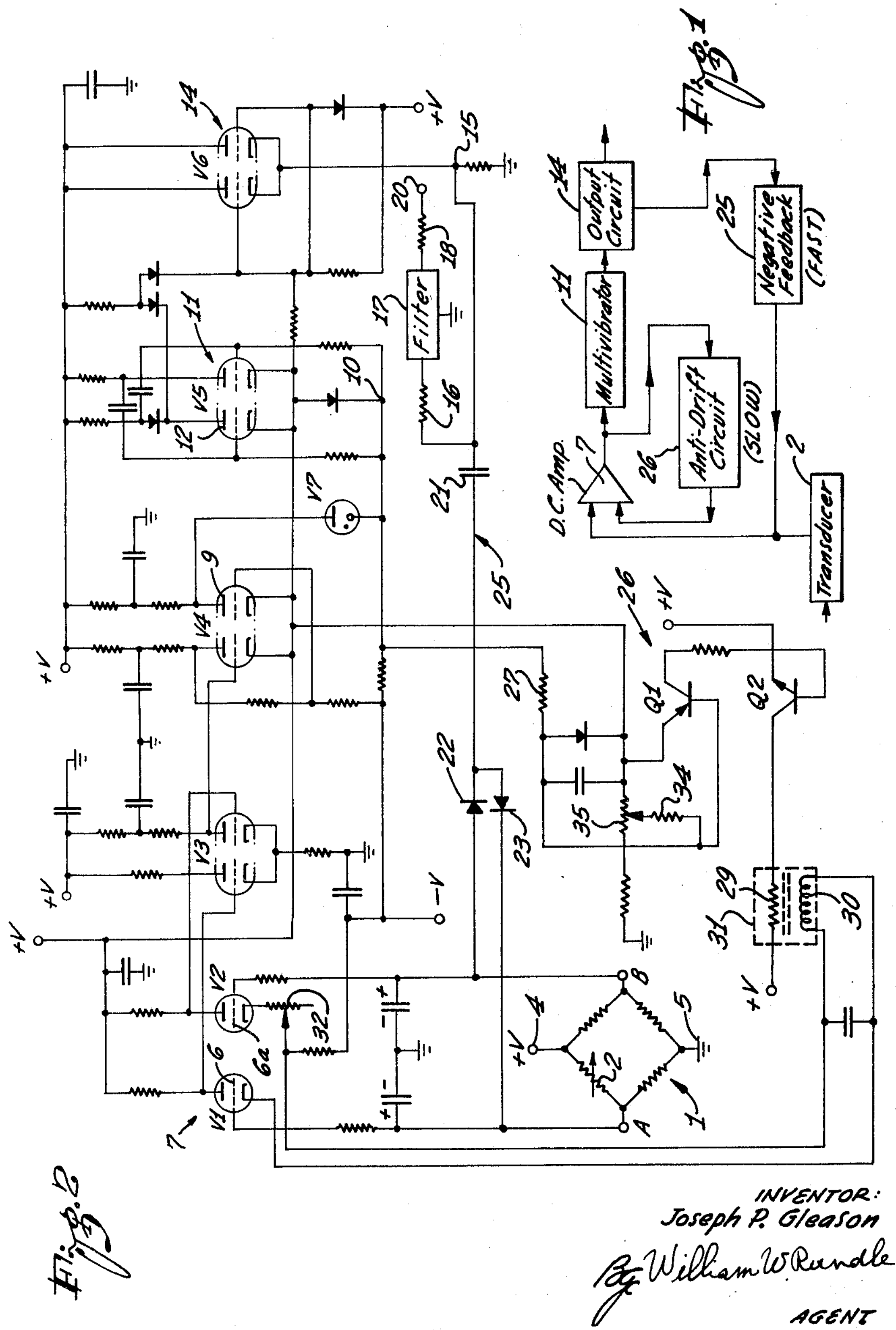

The present invention relates to signal translators, and more particularly, to a data measuring or transmitting system having a voltage controlled oscillator (VCO) for use with an input transducer or sensor having a D.C. output, wherein the change in output frequency of the VCO is proportional to the amplitude of the input signal being measured.

In any high gain D.C. amplifier which amplifies signals from a bridge having a full scale output of 10 to 20 millivolts, for example, extreme stability is normally required in the amplifier input stage. Drift problems due to long term aging of tubes and temperatures changes in both the tube elements and bridge elements, permit the VCO output frequency to wander, and in more severe instances to drift completely out of the operating band. It is an object of this invention to provide a bridge, amplifier, and VCO circuit which eliminates the drift problem without requiring long-term stability in the amplifier stages.

A further object is to provide a system of the type described in which the frequency versus control voltage characteristic of the mutivibrator need not be particularly linear.

In conventional amplifier-VCO systems, no feedback is provided around the multivibrator. It is another object of the present invention to cause the output frequency to follow the input signal with much greater precision than in an open loop approach, by converting the output frequency itself into a current which is employed to cancel the input signal.

Briefly, my invention comprises a conventional D.C. amplifier coupled at its input to a transducer circuit carrying an input signal to be measured, the output of the amplifier being connected to a substantially wide band multivibrator, and the multivibrator output frequency being delivered at a system output terminal. From the multivibrator output, a fast-acting frequency to current converter is connected as negative feedback to the input of the D.C. amplifier so that the output frequency rapidly and precisely follows the applied input signals. A slow-acting anti-drift circuit is connected from the amplifier output back to its input, this anti-drift circuit comprising means of producing an "error" current, means for converting this error current to heat, and means for coupling the heat to a portion of an amplifier input stage, in the proper sense to drive the amplifier output voltage back to a selected "zero-signal" value. The heat coupling means preferably comprises a thermal mass, a heat generating component responsive to current flow therein and a heat-controlled component connected in a control circuit of an amplifier stage.

This invention will be more fully understood by reference to the detailed description of a specific embodiment to follow, and to the accompanying drawings thereof, where FIGURE 1 is a block diagram of the invention, and FIGURE 2 is a detailed schematic diagram of a complete circuit illustrating a preferred form of the invention.

Referring to the drawings, a resistance bridge 1 carries a variable resistance element or transducer 2 which furnishes the input signal to the present system. The transducer 2 may be converting a pressure signal, a strain, a temperature signal, or other signal whose measurement is desired, into an effective electrical signal to be handled by the present electronic circuitry. Transducer 2 may, if desired comprise a double-acting type including an equal and opposite-going resistance in the opposite leg of the bridge 1.

The bridge 1 has the two vertical junctions connected respectively to a positive D.C. input voltage terminal 4 and to ground 5. The two horizontal bridge junctions form the bridge output terminals A and B respectively. Terminals A and B are connected respectively to the separate grids 6 and *6a* of a D.C. differential amplifier 7 comprising input stages V1 and V2, stage V3, and output stage V4. Plate 9 of stage V4 is the output terminal of the amplifier, and couples the amplified output through a voltage reference tube V7 to the input terminal 10 of a wide band multivibrator 11 comprising stage V5.

The output of multivibrator 11 on anode 12 feeds the input of a cathode follower output circuit 14 comprising stage V6. Cathode terminal 15 carries the output signal of V6. A series combination of isolating resistor 16, filter 17, and a further resistor 18 couples this signal to a system output terminal 20 from which the measurement information is taken. The waveform from output terminal 20 may be fed to a frequency meter, a recorder, or utilized in any desired manner.

A feed back caapcitor 21 is connected from cathode terminal 15 to the junction of two oppositely-connected rectifying diodes 22 and 23, in a fast-acting negative feedback circuit 25 which acts as a frequency to current converter. The opposite side of diode 22 is connected to bridge output terminal B, the opposite side of diode 23 is connected to bridge output terminal A.

Diodes 22 and 23 convert the output frequency from V6 to a rectified current flowing to bridge terminals A and B. The amount of this current I in amperes is given by the expression $I=Cf(e_0-2e_D)$, where C is the value of capacitor 21 in farads, $f$ is the output frequency in Hz., $e_0$ is the cathode follower peak-to-peak output in volts, and $e_D$ is the forward voltage drop of a diode 22 or 23 when conducting.

Normally, with no signal input applied to transducer 2, the output terminals A and B would produce an equal D.C. level if the bridge is balanced. However, a rectified current through diodes 22 and 23 will cause a slight deflection of the bridge, and it is slightly unbalanced in actual operation with zero input signal. The output frequency at this time at cathode terminal 15 has a value designated $f_0$.

When the bridge 1 tends to change because of an applied signal affecting the transducer 2, the change is detected immediately by the amplifier 7, resulting in an amplified signal at plate 9 of stage V4. This signal immediately causes a change in frequency of the multivibrator 11. The changed frequency causes a new value of rectified current through diodes 22 and 23 from capacitor 21, which almost entirely cancels the initiating change at the bridge.

Because of this strong negative feedback, the current feedback through the diodes provides a linear following of the input current by the output frequency, and the frequency versus control voltage characteristic of the multivibrator 11 need not be particularly linear.

To avoid a long term drift problem, an anti-drift circuit 26 is provided as a servo loop around the D.C. amplifier 7. This servo comprises an input resistor 27 connected at one end to multivibrator input terminal 10, transistors Q1 and Q2, a heating resistor 29, and a coil 30. The latter two components 29 and 30 are maintained in a heat exchange block 31, preferably copper, for example, which may have an appreciable mass of a few ounces. Coil 30 may comprise 1500 turns, for example, of wire and is connected to serve as a cathode resistor of amplifier input stage V1. The other input stage V2 has an adjustable resistor 32 which may be set to equal approximately the resistance of coil 30 at a certain operating temperature. It will be noted that V1 and V2 form a differential amplifier in which a cathode balancing resistance is split into two parts. A first part is adjustable resistor 32, which does not vary in actual circuit operation, and the second part is the coil 30 whose resistance can vary over an appreciable range due to temperature changes thereof.

In this anti-drift circuit 26, advantage is taken of the fact that the multivibrator 11 has a reasonably stable output frequency versus input voltage characteristic. This input voltage is relatively large, having typically an 18 volt swing, for example, for a frequency swing of about 30 percent of $f_0$. This constitutes an analog equivalent of the output frequency and makes it possible to introduce a very slow acting servo which asks that this analog equivalent voltage maintain itself at a certain level, which level corresponds to the zero-signal output frequency $f_0$ of multivibrator 11.

The above analog voltage appears at multivibrator input terminal 10, where an equivalent analog current flows through the input resistor 27 to the anti-drift circuit 26. A control resistor 34 carries a fixed current from a potentiometer 35. If the two respective currents through resistors 27 and 34 are about equal, Q1 is held at a selected point in the middle of its operating range. Q1 amplifies the error signal (or difference current). The output of Q1 is applied to the base of Q2 which in turn controls current flow through the heating resistor 29. This latter resistor 29 dissipates heat for the purpose of changing the resistance of coil 30 as mentioned hereinbefore.

If the current through control resistor 34 does not closely match the feedback current through input resistor 27, transistors Q1 and Q2 will operate to modify the temperature of coil 30 so that the input stages V1 and V2 slowly change balance until the analog control voltage at multivibrator input terminal 10 attains the selected level. Because of the thermal mass between heating resistor 29 and coil 30, very long response times are possible, up to several minutes or longer. In other words, the time constant of the anti-drift circuit 36 is very long. For instance, a sudden change of one volt, for example, at D.C. amplifier output 9 (at terminal 10 also) would not produce a change in resistance of cathode resistor 30 for about two minutes, say. Yet instantly the frequency of multivibrator 11 would have changed to produce the desired output signal proportional to the one-volt amplifier output voltage change, as described on page 6, lines 5–13. This output signal is taken from the equipment at terminal 20.

Because of the two feedback loops which have been described, the VCO and a low level strain gage bridge can run for long periods of time experiencing temperature changes, without appreciable drift of the output frequency. The bridge itself does not need to be well temperature compensated. In most applications, the change in effect being measured occurs suddenly, and this is the type of measurement which is most suitable for the present invention. The VCO holds its selected frequency $f_0$ until the signal change occurs, then it accurately records any rapid changes. The entire recording period is normally finished before the slow-acting anti-drift circuit 26 has time to modify the output frequency.

The fast negative feedback loop 25 can be adapted to single-ended inputs rather than the differential bridge shown herein, by grounding one of the two input points A or B, and providing a quiescent input current to the underground input terminal from a resistor which goes to a regulated power supply.

The present disclosure shows primarily a vacuum tube design for radiation environments. In view of the slow thermal response, the degradation of transistors Q1 and Q2 due to a severe nuclear radiation environment, for example, will not have time to produce a frequency error. For non-radiation environments, transistors or other semiconductors could be used throughout, with suitable different power supplies.

What is claimed is:

1. A data measuring system comprising:

(a) an input signal circuit adapted to receive an input signal to be measured;

(b) a high gain D.C. amplifier connected to said input circuit;

(c) a voltage controlled multivibrator connected to the output of said D.C. amplifier;

(d) fast-acting negative feedback means connected from the output of said multivibrator to an input of said amplifier; and (e) a slow-acting servo circuit having a response time of at least several seconds connected from the output of said amplifier to an input of said amplifier, said servo circuit including means to maintain the zero-signal output voltage of said amplifier at a predetermined constant D.C. regardles of long term drift tendencies;

(f) whereby the output frequency of said multivibrator does not drift but is immediately and accurately responsive to changes of said input signal.

2. Apparatus in accordance with claim 1 wherein said slow-acting servo circuit comprises a heat-responsive element connected in an input stage of said D.C. amplifier, said element having a varying electrical characteristic in response to the temperature of said element; a heat producing element having a temperature responsive to current flow therethrough, said two elements being mounted in heat transfer relation in a thermal mass; means monitoring the DC voltage of said amplifier; and control means responsive to said monitoring means to regulate the current flow in said heat producing element in the amount necessary to tend to maintain said output voltage as recited.

References Cited

UNITED STATES PATENTS

| | | | |
|---|---|---|---|
| 2,572,108 | 10/1951 | Chalhoub | 330—143 |
| 2,617,842 | 11/1952 | Fink | 324—99 |
| 2,958,832 | 11/1960 | Clark | 330—110 XR |
| 3,064,193 | 11/1962 | Grubb et al. | 324—99 XR |
| 3,201,781 | 8/1965 | Holland | 324—120 XR |
| 3,218,570 | 11/1965 | Godier | 330—143 |
| 3,237,116 | 2/1966 | Skinner et al. | 330—9 |
| 3,275,942 | 9/1966 | Liu | 330—143 XR |
| 3,359,410 | 12/1967 | Frisby et al. | 330—9 XR |
| 3,366,888 | 1/1968 | Kawashima et al. | 330—9 |
| 3,375,351 | 3/1968 | Davenport et al. | 324—99 XR |

RUDOLPH V. ROLINEC, Primary Examiner

E. F. KARLSEN, Assistant Examiner

U.S. Cl. X.R.

324—99